(12) United States Patent
Hoentschel et al.

(10) Patent No.: US 8,357,604 B2
(45) Date of Patent: Jan. 22, 2013

(54) WORK FUNCTION ADJUSTMENT IN HIGH-K GATE STACKS FOR DEVICES OF DIFFERENT THRESHOLD VOLTAGE

(75) Inventors: Jan Hoentschel, Dresden (DE); Sven Beyer, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 175 days.

(21) Appl. No.: 12/905,501

(22) Filed: Oct. 15, 2010

(65) Prior Publication Data

US 2011/0127616 A1 Jun. 2, 2011

(30) Foreign Application Priority Data

Nov. 30, 2009 (DE) .................... 10 2009 047 310

(51) Int. Cl.
H01L 21/3205 (2006.01)
H01L 21/4763 (2006.01)

(52) U.S. Cl. . 438/592; 257/392; 257/369; 257/E21.625; 257/E21.637

(58) Field of Classification Search .................. 257/392, 257/391
See application file for complete search history.

(56) References Cited

U.S. PATENT DOCUMENTS

| | | | |
|---|---|---|---|
| 2002/0135030 A1 | 9/2002 | Horikawa | 257/405 |
| 2008/0258229 A1* | 10/2008 | Ohkawa et al. | 257/369 |
| 2009/0108294 A1 | 4/2009 | Choi et al. | 257/190 |
| 2009/0108373 A1 | 4/2009 | Frank et al. | 257/392 |
| 2009/0212371 A1 | 8/2009 | Kobayashi | 257/369 |
| 2010/0001348 A1* | 1/2010 | Mitsuhashi et al. | 257/368 |
| 2010/0197128 A1* | 8/2010 | Schaeffer et al. | 438/591 |
| 2010/0327373 A1 | 12/2010 | Carter et al. | 257/392 |
| 2011/0049642 A1 | 3/2011 | Scheiper et al. | 257/392 |
| 2012/0080757 A1* | 4/2012 | Kato et al. | 257/369 |

FOREIGN PATENT DOCUMENTS

| | | |
|---|---|---|
| DE | 102009031155 A1 | 1/2011 |
| DE | 102009039418 A1 | 3/2011 |
| WO | WO 2010140244 A1 * | 12/2010 |

OTHER PUBLICATIONS

Translation of Official Communication from German Patent Office for German Patent Application No. 10 2009 047 310.6 dated Aug. 9, 2010.
Translation of Official Communication from German Patent Office for German Patent Application No. 10 2009 047 310.6 dated Jun. 17, 2011.

* cited by examiner

Primary Examiner — Michelle Mandala
Assistant Examiner — Shaka White
(74) Attorney, Agent, or Firm — Williams, Morgan & Amerson, P.C.

(57) ABSTRACT

In sophisticated semiconductor devices, different threshold voltage levels for transistors may be set in an early manufacturing stage, i.e., prior to patterning the gate electrode structures, by using multiple diffusion processes and/or gate dielectric materials. In this manner, substantially the same gate layer stacks, i.e., the same electrode materials and the same dielectric cap materials, may be used, thereby providing superior patterning uniformity when applying sophisticated etch strategies.

17 Claims, 9 Drawing Sheets

WORK FUNCTION ADJUSTMENT IN HIGH-K GATE STACKS FOR DEVICES OF DIFFERENT THRESHOLD VOLTAGE

BACKGROUND OF THE INVENTION

1. Field of the Invention

Generally, the present disclosure relates to the fabrication of highly sophisticated integrated circuits including advanced transistor elements that comprise gate electrode structures including a high-k gate dielectric.

2. Description of the Related Art

Advanced integrated circuits, such as CPUs, storage devices, ASICs (application specific integrated circuits) and the like, include a large number of circuit elements on a given chip area according to a specified circuit layout. In a wide variety of integrated circuits, field effect transistors represent one important type of circuit element that substantially determines performance of the integrated circuits. Generally, a plurality of process technologies are practiced for forming field effect transistors, wherein, for many types of complex circuitry, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the scaling of the channel length, and associated therewith the reduction of channel resistivity, which in turn causes an increase of gate resistivity due to the reduced dimensions, has been a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or other materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although usage of high speed transistor elements having an extremely thin gate dielectric may be restricted to high speed signal paths, whereas transistor elements with a thicker gate dielectric may be used for less critical circuit portions, such as storage transistor elements and the like, the relatively high leakage current caused by direct tunneling of charge carriers through an ultra-thin silicon dioxide gate insulation layer may reach values for an oxide thickness in the range of 1-2 nm that may not be compatible with requirements for many types of circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

As is well known, the work function of the gate dielectric material may significantly affect the finally obtained threshold voltage of field effect transistors, in particular when the doping in the channel region is reduced, which is presently accomplished by appropriately doping the polysilicon material, which may be used in combination with a silicon oxide-based material in conventional gate electrode structures. Upon introducing a high-k dielectric material, the adjustment of an appropriate work function may require the incorporation of appropriate metal species into the gate dielectric material, for instance in the form of lanthanum, aluminum and the like, in order to obtain appropriate work functions and thus threshold voltages for P-channel transistors and N-channel transistors. Moreover, the sensitive high-k dielectric material may have to be protected during the processing, while also a contact with well-established materials, such as silicon and the like, may be considered disadvantageous since the Fermi level may be significantly affected upon contacting a high-k dielectric material, such as hafnium oxide, with a polysilicon material. Consequently, a metal-containing cap material may typically be provided on the high-k dielectric material when provided in an early manufacturing stage. Additionally, the metal-containing material may provide superior conductivity and may also avoid any depletion zone, which may be observed in polysilicon gate electrode structures. Consequently, a plurality of additional process steps and material systems are introduced in well-established CMOS process techniques in order to form gate electrode structures including a high-k dielectric material in combination with a metal-containing electrode material. In other strategies, replacement gate approaches may be applied in which essentially gate electrode structures may be provided as placeholder material systems, wherein, after finishing the basic transistor configurations, the gate electrode structures may be replaced by at least an appropriate metal-containing electrode material, possibly in combination with a high-k dielectric material, thereby requiring complex process sequences for removing the initial gate material, such as polysilicon, and forming appropriate metal species, wherein appropriate work function values also have to be adjusted by incorporating corresponding work function adjusting species, as discussed above.

In addition to enhancing performance of gate electrode structures by incorporating a high-k dielectric material in sophisticated semiconductor devices, frequently, transistor elements of different characteristics, for instance of different leakage behavior, different threshold voltage, and the like, have to be provided, thereby requiring a gate dielectric material of different material composition and/or of different thickness and/or different work function values.

In sophisticated technologies based on high-k metal gate electrode structures, the per se extremely complex patterning process for forming gate electrode structures of the desired reduced gate length may become additionally more complex in so-called "gate first" approaches in which the different transistor characteristics, such as different threshold voltages, have to be adjusted in an early manufacturing stage. That is, in some approaches, the gate layer stacks of transistors of different conductivity type may comprise very different material layers and barrier layers, which may thus contribute to an increased degree of complexity during the patterning process, which in turn may result in patterning-related irregularities. Upon introducing further differences in the gate layer stack, for instance by requiring different threshold voltage levels for otherwise similar transistors, the complexity of the patterning process may be even further increased, thereby making these approaches less than desirable in volume production environments.

In other approaches, very similar gate layer stacks for P-channel transistors and N-channel transistors may be provided, while nevertheless enabling the adjustment of appropriate work function values with respect to the semiconductor material of these transistor elements. Although these approaches may allow the patterning of gate electrode structures of P-channel transistors and N-channel transistors with superior integrity compared to other approaches using very different gate layer stacks, the adjustment of different threshold voltages for a plurality of semiconductor devices, such as transistors of the same conductivity type with different transistor behavior, may still be difficult, as will be described in more detail with reference to FIGS. 1a-1c.

Figure 1A:
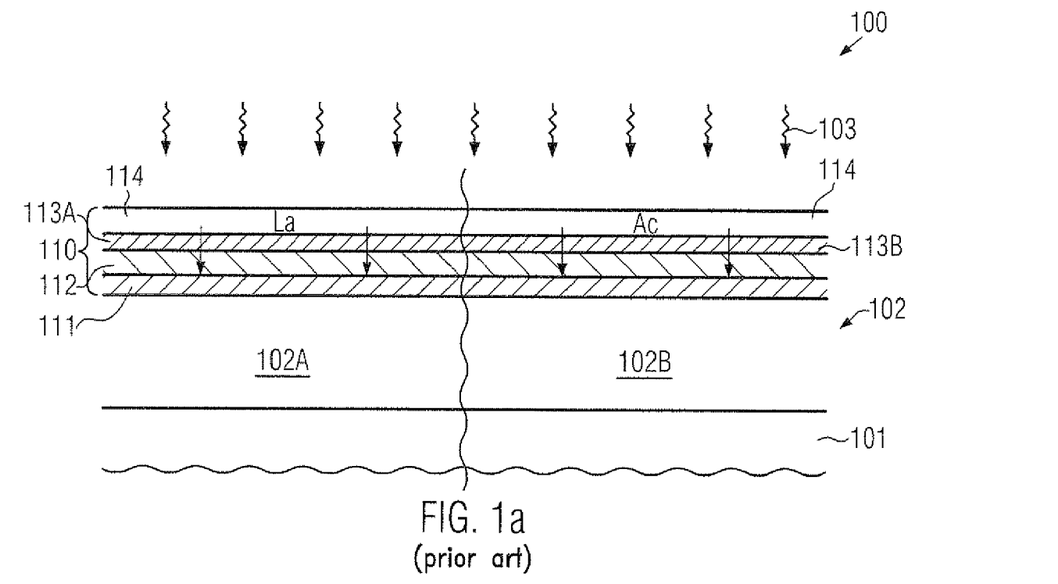
FIGS. 1a-1b schematically illustrate cross-sectional views of a semiconductor device during forming a sophisticated high-k metal gate electrode structure on the basis of a diffusion process, according to conventional strategies.

FIG. 1a schematically illustrates a cross-sectional view of a semiconductor device 100 which comprises a substrate 101 and a semiconductor layer 102 formed above the substrate 101. The semiconductor layer 102 is typically provided in the form of a silicon material, as explained above. Furthermore, a first semiconductor region or active region 102A and a second semiconductor region or active region 102B are provided in the semiconductor layer 102. The active regions 102A, 102B are to be understood as semiconductor regions in and above which transistor elements are to be formed on the basis of gate electrode structures including a high-k dielectric material. In the example shown, it may be assumed that an N-channel transistor is to be formed in and above the active region 102A, while a P-channel transistor is to be formed in and above the active region 102B. Furthermore, in the manufacturing stage shown, a layer stack 110 is formed above the active regions 102A, 102B and comprises a gate dielectric material including a first dielectric material 111, such as a silicon dioxide material, a silicon oxynitride material and the like, in combination with a high-k dielectric material 112, such as a hafnium oxide-based material and the like. Furthermore, the layer stack 110 comprises a diffusion layer 113A which may represent any appropriate material layer including a metal species for adjusting the work function of a gate electrode structure to be formed on the active region 102A. For instance, the layer 113A may comprise lanthanum which, when diffused into the underlying material, may result in a desired work function in combination with an electrode material still to be formed. On the other hand, the layer stack 110 may comprise a diffusion layer 113B formed above the active region 102B and comprising an appropriate metal species, such as aluminum, which may result in a desired work function in combination with the electrode metal still to be formed. Furthermore, in the example shown, a further cap layer 114, such as a titanium nitride material, may be provided so as to confine the materials 113A, 113B.

The semiconductor device 100 as illustrated in FIG. 1a may be formed on the basis of any well-established process techniques including processes for forming an isolation structure (not shown) in order to define the lateral size and position of the active regions 102A, 102B within the semiconductor layer 102. Prior to or after forming the isolation structures, an appropriate well dopant species may be incorporated, thereby defining the basic conductivity of the transistor elements still to be formed in and above the active regions 102A, 102B. It should be appreciated that other dopant species may also be incorporated in order to control the resulting threshold voltage, wherein, however, in advanced semiconductor devices, typically, the dopant concentration in the channel regions of these devices may have to be reduced in order to reduce leakage currents and reduce charge carrier scattering. Consequently, upon providing a reduced channel doping, the resulting threshold voltage may be substantially determined on the basis of the electronic characteristics of the semiconductor material and the work function of the gate electrode material in combination with the intermediate gate dielectric materials 111 and 112. Next, the gate dielectric material 111 may be formed, for instance, by deposition, oxidation and the like, depending on the overall process strategy. Thereafter, the high-k dielectric material 112 is deposited, for instance, by chemical vapor deposition (CVD) and the like. For example, the thickness of the material layer 111 may be one nanometer and less, while the layer 112 having the increased dielectric constant may have a thickness of one nanometer to several nanometers, depending on the desired level of leakage currents and the like. Thereafter, the layers 113A, 113B may be formed, for instance, by depositing the layer 113A and removing the material from above the active region 102B. Thereafter, the layer 113B may be deposited and may be removed from above the active region 102A on the basis of appropriate etch masks and etch recipes. Finally, the titanium nitride material 114 may be deposited on the basis of sputter deposition and the like. It should be appreciated that other process strategies may be applied, for instance by forming an additional barrier material, for instance after removing one of the layers 113A, 113B from above one of the active regions 102A, 102B and depositing the other one of the layers 113A, 113B without requiring the removal of an unwanted portion of this material layer. Thereafter, a heat treatment 103, for instance applying temperatures several hundred degrees Celsius to nine hundred degrees Celsius may be applied in order to initiate a diffusion of the metal species in the layers 113A, 113B into the high-k dielectric material 112, thereby also positioning the metal species at an interface formed by the layers 111 and 112. As will be discussed later on with reference to FIG. 1c, it is assumed that the incorporated metal species may build up dipole charges, which in turn may result in a corresponding adaptation of the work function after forming a gate electrode material.

After the anneal process 103, the layers 114 and 113A, 113B may be removed, for instance, by wet chemical etch recipes, wherein the high-k dielectric material 112 may act as an efficient etch stop material. Next, a metal-containing electrode material, such as titanium nitride or any other appropriate electrode metal, may be deposited in combination with a conventional electrode material, such as silicon, which may be accomplished on the basis of well-established process techniques. Consequently, the same electrode layer stack may be provided above the active regions 102A, 102B. Moreover, additional materials, such as dielectric cap materials, hard mask materials and the like, may be applied as are required for the patterning of the resulting layer stack.

Figure 1B:
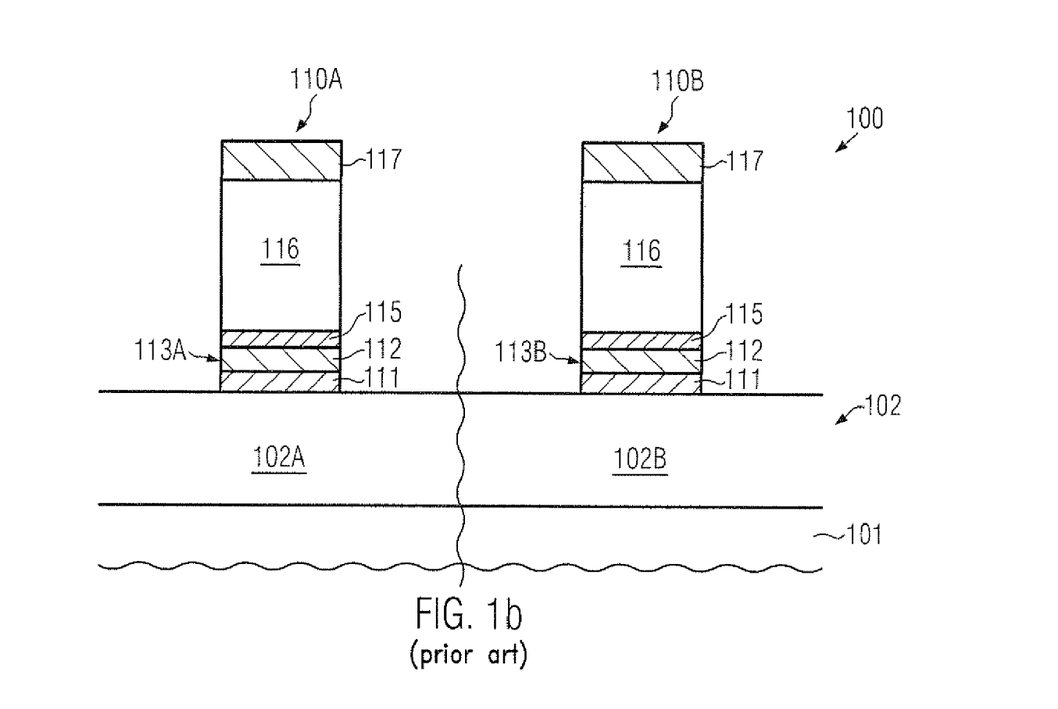

FIG. 1b schematically illustrates the semiconductor device 100 in a further advanced manufacturing stage in which a gate electrode structure 110A is formed on the active region 102A and a gate electrode structure 110B is formed on the active region 102B. The gate electrode structure 110A comprises the gate dielectric materials 111 and 112 in which, due to the preceding treatment, the work function metal species 113A, such as lanthanum, may be incorporated. Similarly, the gate electrode structure 110B comprises the gate dielectric materials 111 and 112 having incorporated therein the work function metal species 113B, such as aluminum. Moreover, the gate electrode structures 110A, 110B comprise metal-containing electrode material 115, such as titanium nitride, followed by a further electrode material 116, such as silicon. Furthermore, a dielectric cap material 117, for instance in the form of silicon nitride, silicon dioxide and the like, is typically provided. Consequently, the gate electrode structures 110A, 110B may have basically the same configuration, which may represent a significant advantage upon patterning the various material layers formed therein. Consequently, an appropriate etch strategy may be applied for both gate electrode structures 110A, 110B, thereby obtaining a highly uniform process result, thereby making this approach superior compared to other approaches in which significantly different gate electrode layer stacks may have to be patterned. On the other hand, despite the same electrode materials provided in the gate electrode structures 110A, 110B, a desired threshold voltage may be obtained for the active regions 102A, 102B due to the presence of the different work function adjusting species 113A, 113B.

Figure 1C:
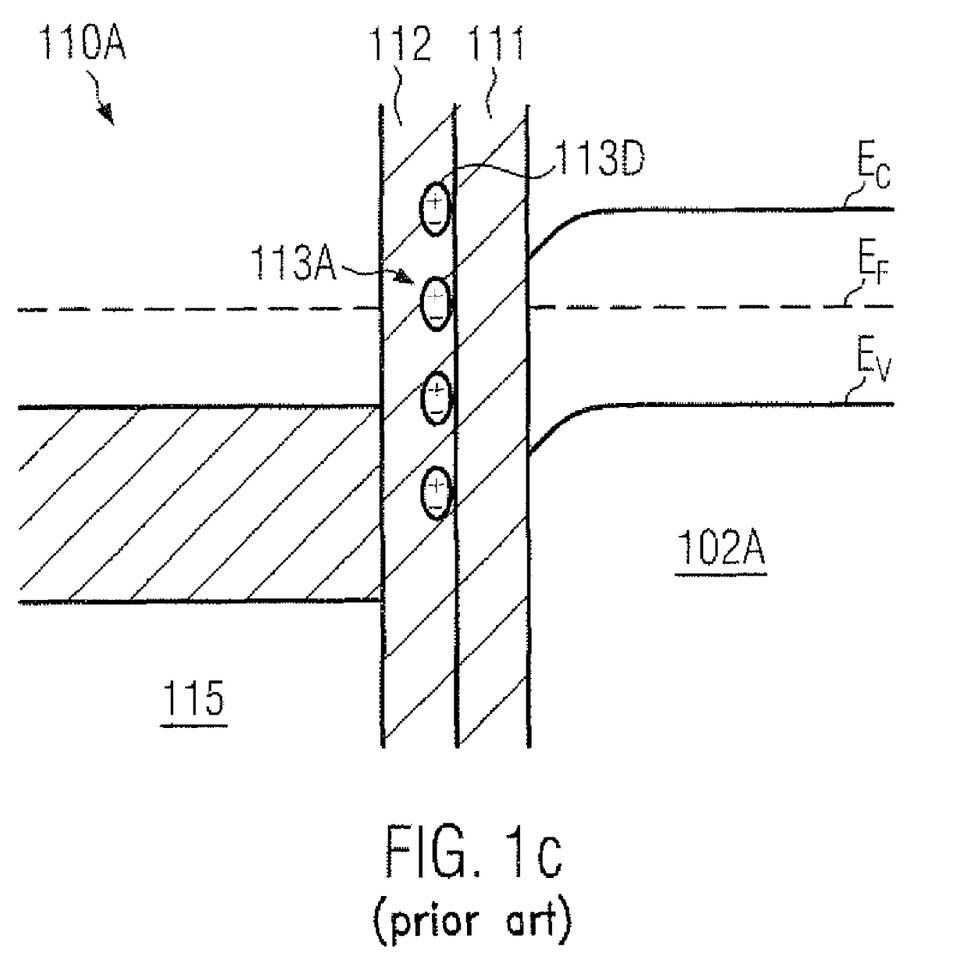
FIG. 1c schematically illustrates a band model of a gate electrode structure comprising a gate dielectric material including a diffused work function adjusting metal species.

FIG. 1c schematically illustrates the electronic situation of the gate electrode structure 110A according to a band model. It should be appreciated that the present application is not to be restricted to any theory disclosed herein, which may nevertheless be helpful in understanding the basic mechanism for adjusting the threshold voltages of transistors. For example, as illustrated, the dielectric gate materials 111 and 112 may separate the channel region, indicated as 102A, representing a part of the active region 102A as shown at the right hand side, from the gate electrode material 115 illustrated at the left hand side of the dielectric materials 111 and 112. Furthermore, due to the previously incorporated work function metal species 113A, deep hole charges 113D may be generated, in particular at an interface between the materials 111 and 112. Consequently, the energy levels of the lower conduction band edge indicated as $E_C$ and the upper edge of the valence band, indicated as $E_V$, may be appropriately bent at the interface of the layer 111 and the channel region 102A, which is strongly influenced by the charges 113D. Consequently, for a given work function of the material 115, an appropriate adaptation with respect to the flat band energy, indicated as $E_F$, may be accomplished for both types of gate electrode structures since a corresponding adaptation may also be accomplished for the active region 102B (FIG. 1b) on the basis of the work function metal species 113B. Hence, the appropriate threshold voltage for both types of transistors may be obtained, irrespective of the fact that the actual electrode material may be the same for both gate electrode structures 110A, 110B of FIG. 1b.

Although the concept of providing diffusion cap materials is promising, i.e., the layers 113A, 113B, possibly in combination with the material 114 (FIG. 1a) in an early manufacturing stage for adjusting the work function and thus threshold voltage for a common electrode material for both types of transistors, it is difficult to provide transistor elements of different threshold voltage, which may typically be required in complex integrated circuits when, for instance, different "flavors" of basically the same transistor configuration may be required, or in mixed signal applications using analog and digital circuit portions.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a work function adjusting species may be incorporated into a gate dielectric material including a high-k material on the basis of a diffusion process that may be performed prior to patterning the gate electrode structure. Furthermore, in accordance with the principles disclosed herein, a plurality of different threshold voltages may be adjusted, for instance, different threshold voltage levels for transistors of the same conductivity type and the like, while at the same time the same electrode material or materials may be used for each of the different gate electrode structures. For this purpose, the diffusion activity of the various work function metal species may be controlled differently for the various types of electrode structures, which may be accomplished by performing two or more heat treatments under different conditions for the various gate electrode structures and/or by appropriately adapting a thickness of the gate dielectric materials without requiring a modification of the actual electrode materials and/or by providing different diffusion cap layers that may result in a different diffusion behavior in different device regions, or any combination of these control mechanisms. Consequently, prior to providing the one or more electrode materials for the different types of gate electrode structures to be provided in a sophisticated semiconductor device, an appropriate "patterning" of the electronic characteristics and/or the material composition and/or the thickness of the gate dielectric materials may be applied, thereby obtaining, possibly in combination with differently selected work function metal species and/or in combination with differently set anneal process parameters, the desired different threshold voltage levels, while not unduly affecting the complex patterning regime for forming the gate electrode structures. Since any variations in the overall gate layer stack composition may occur with respect to the gate dielectric material only, any pronounced differences in height may be avoided, which may also contribute, in combination with the identical configuration of the electrode materials, to a very uniform patterning process.

One illustrative method disclosed herein relates to forming transistors of different threshold voltages. The method comprises forming a dielectric base layer, a high-k dielectric material and a metal-containing material above a plurality of semiconductor regions, wherein a thickness of the dielectric base layer and/or of the high-k dielectric material is different for each of the plurality of semiconductor regions. The method further comprises performing a heat treatment so as to diffuse a metal species from the metal-containing material into at least the high-k dielectric material above at least some of the plurality of semiconductor regions. Additionally, the method comprises forming an electrode material above the high-k dielectric material above each of the plurality of semiconductor regions and forming a gate electrode structure on each of the plurality of semiconductor regions from the electrode material, the dielectric base layer and the high-k dielectric material. Furthermore, drain and source regions are formed in each of the plurality of semiconductor regions.

A further illustrative method disclosed herein comprises forming a high-k dielectric material and a metal-containing material above a first semiconductor region and a second semiconductor region of a semiconductor device. The method further comprises adjusting a first work function level for the first semiconductor region and a second work function level for the second semiconductor region by controlling the diffusion of a metal species into the high-k dielectric material, wherein the first and second work function levels are different. The method further comprises forming an electrode material above the first and second semiconductor region. Moreover, a first gate electrode structure is formed on the first semiconductor region and a second gate electrode structure is formed on the second semiconductor region by using the high-k dielectric material and the electrode material. Additionally, the method comprises forming a first transistor in and above the first semiconductor region and a second transistor in and above the second semiconductor region, wherein the first and second transistors have the same conductivity type.

One illustrative semiconductor device disclosed herein comprises a plurality of transistors having different threshold voltages. Each transistor comprises a gate electrode structure comprising a gate dielectric material including a high-k material, a metal-containing electrode material formed on the gate dielectric material and a semiconductor material formed on the metal-containing electrode material. The metal-containing electrode material has the same composition in each gate electrode structure of the plurality of transistors.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which a uniform gate patterning process may be achieved on the basis of a high-k gate metal electrode base structure, while nevertheless providing the possibility of implementing transistors of different conductivity types and different threshold voltages, as required by complex circuits. For example, different flavors of N-channel transistors and/or P-channel transistors may be obtained on the basis of basically the same gate electrode structure, i.e., on the basis of the same electrode material or materials wherein a difference in threshold voltage may be achieved by appropriately adjusting the electronic characteristics of the gate dielectric material for the various transistor devices. The "patterning" of the electronic characteristics of the gate dielectric material may be accomplished in an early manufacturing phase, i.e., prior to actually providing the electrode material or materials commonly for any type of gate electrode structure. This may be accomplished by using multiple anneal processes and/or different work function metal species and/or different layer thicknesses or compositions of the gate dielectric material and/or applying different process parameters during one or more anneal processes for initiating the diffusion of the work function metal species. In this manner, for a given electrode material, such as titanium nitride and the like, which may be used commonly for any type of gate electrode structure, any desired work function may be adjusted by incorporating work function metal species, such as tantalum, aluminum and the like, into the gate dielectric material on the basis of differently controlled diffusion conditions and/or on the basis of different gate dielectric layer stacks. Consequently, sophisticated gate patterning strategies may be adapted to the basic gate layer stack configuration with only minimal differences, which may thus result in superior uniformity, for instance in gate length and the like.

With reference to FIGS. 2a-2m, further illustrative embodiments will now be described in more detail, wherein reference may also be made to FIGS. 1a-1c, if appropriate.

Figure 2A:
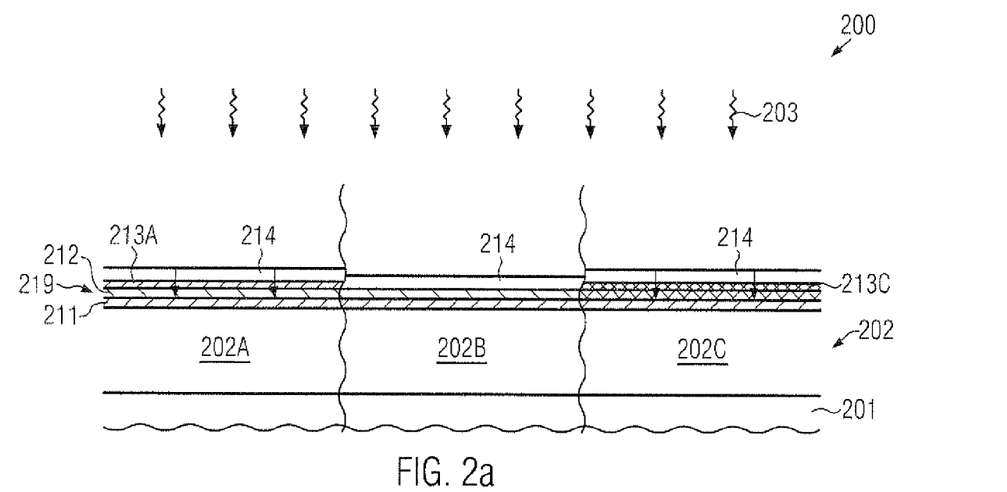
FIGS. 2a-2d schematically illustrate cross-sectional views of a semiconductor device during various manufacturing stages in controlling the diffusion of a work function metal species into a high-k dielectric material on the basis of a sequence of anneal processes, according to illustrative embodiments.

FIG. 2a schematically illustrates a cross-sectional view of a semiconductor device 200 comprising a substrate 201 and a semiconductor layer 202 formed above the substrate 201. As previously discussed with reference to the semiconductor device 100, the substrate 201 and the semiconductor layer 202 may represent any appropriate configuration for forming circuit elements, such as transistors and the like. For example, the substrate 201 and the semiconductor layer 202 may represent, at least locally within the device 200, a bulk configuration in which the semiconductor layer 202 may represent an upper portion of a crystalline semiconductor material of the substrate 201. In other cases, when a buried insulating material (not shown) is formed between the substrate 201 and the semiconductor layer 202, a silicon-on-insulator (SOI) configuration may be obtained. Typically, the semiconductor layer 202 may represent a silicon-based material since most advanced complex integrated circuits may be formed on the basis of silicon. It should be understood, however, that any other appropriate semiconductor materials may be used in the layer 202, if considered appropriate. For example, it may be advantageous to provide a different type of semiconductor material in order to obtain a desired band gap offset, at least for some transistor devices, which may be accomplished by providing other semiconductor materials, such as silicon/germanium and the like. The semiconductor layer 202 may comprise a plurality of semiconductor regions 202A, 202B and 202C which may also be referred to as active regions and which may be used for forming therein and thereabove corresponding transistor elements, as is also previously discussed. It should further be appreciated that the semiconductor regions 202A, 202B, 202C may correspond to different device areas of the device 200, such as different circuit portions and the like, which may be laterally separated by a distance that may be significantly greater compared to lateral dimensions of the individual active regions. For example, one or more of the active regions 202A, 202B, 202C may correspond to a device area in which generally transistors of superior leakage current behavior may be required, while others of the active regions may represent critical signal paths in which high performance transistors may be required. Furthermore, it should be appreciated that some or all of the active regions 202A, 202B, 202C may represent the same conductivity type, wherein, however, different threshold voltages of the corresponding transistors may be required in accordance with the overall circuit configuration. In the embodiment shown in FIG. 2a, active regions 202A, 202B, 202C may represent transistors of different conductivity type, thereby requiring a corresponding adaptation of the work function to the electronic situation in the underlying active regions, as previously explained with reference to FIG. 1c.

Furthermore, in the manufacturing stage shown, a gate dielectric material 219 may be formed on the active regions 202A, 202B, 202C and may comprise a dielectric base layer 211 in combination with a high-k dielectric material 212. It should be appreciated that the high-k dielectric material 212 may represent any material having a dielectric constant of 10.0 and higher. It should be appreciated that a dielectric constant of a material layer in semiconductor processing may be determined on the basis of well-established measurement techniques, i.e., by forming a capacitive structure and determining the frequency response of the structure in accordance with well-defined measurement conditions. For example, the high-k dielectric material may comprise one or more of the above-identified species, such as hafnium oxide, hafnium oxide including silicon and nitrogen, zirconium oxide-based materials and the like. Furthermore, in the embodiment shown, the thickness and material composition of the gate dielectric material 219 may be the same in any of the active regions 202A, 202B, 202C except for any process-related variations. In other cases, as will be described later on in more detail, the thickness of the dielectric material 219 and/or the material composition may be adjusted differently in some of the active regions 202A, 202B, 202C. Furthermore, a diffusion cap layer 213A, such as a lanthanum layer and the like, may be formed above the gate dielectric material 219 above the active region 202A and may thus comprise an appropriate work function metal species which may, for convenience, also be referred to as a species 213A. On the other hand, a diffusion cap layer 213C comprising an appropriate metal diffusion species 213C, such as aluminum, may be formed above the active region 202C. For instance, the material 213C may be provided as an aluminum layer, an aluminum nitride layer and the like. It should be appreciated, however, that other work function metal species may be provided, if desired. Moreover, a cap layer 214, such as a titanium nitride material and the like, may be formed above the active regions 202A, 202B, 202C. In the embodiment shown, a dedicated metal species may not be provided above the active region 202B, since a corresponding work function adjustment may take place in a later manufacturing stage.

The semiconductor device 200 as illustrated in FIG. 2a may be formed on the basis of the following processes. After providing the active regions 202A, 202B, 202C, which may be accomplished by forming isolation structures (not shown) and incorporating appropriate dopant species, as is, for instance, previously discussed with the semiconductor device 100, the gate dielectric material 219 may be formed by any appropriate oxidation and/or deposition technique, possibly in combination with a surface treatment for the dielectric base layer 211, followed by the deposition of the high-k material 212. It should be appreciated that one or both of the layers 211, 212 may be provided with a different thickness, as will be discussed later on in more detail. Next, one of the layers 213A, 213C may be deposited and may be appropriately patterned so as to remove this layer from unwanted portions, which may be accomplished by using an appropriate masking regime in combination with etch chemistries, such as wet chemical etch chemistries, while using the high-k material 212 as an efficient etch stop material. Thereafter, the other one of the layers 213A, 213C may be deposited and may be subsequently removed from unwanted areas, and in particular from above the active region 202B. Finally, the cap layer 214 may be deposited according to well-established process techniques. Next, a heat treatment 203 may be performed on the basis of any appropriate process parameters, such as temperature and duration, for instance using temperatures in the range of 500-900° C. for approximately 5-60 seconds in order to initiate diffusion of the species 213A and 213C into the underlying gate dielectric material 219, as is also previously discussed with reference to the device 100. On the other hand, the diffusion of any metal species into the dielectric material 219 above the active region 202B may only be fed by the layer 214, which may have a moderately high thermal stability. It should be appreciated that appropriate process parameters for the heat treatment 203 may be readily determined on the basis of experiments. Thereafter, the materials 214, 213A, 213C may be removed on the basis of wet chemical etch recipes and the like, while using the material 212 as an efficient etch stop material.

Figure 2B:
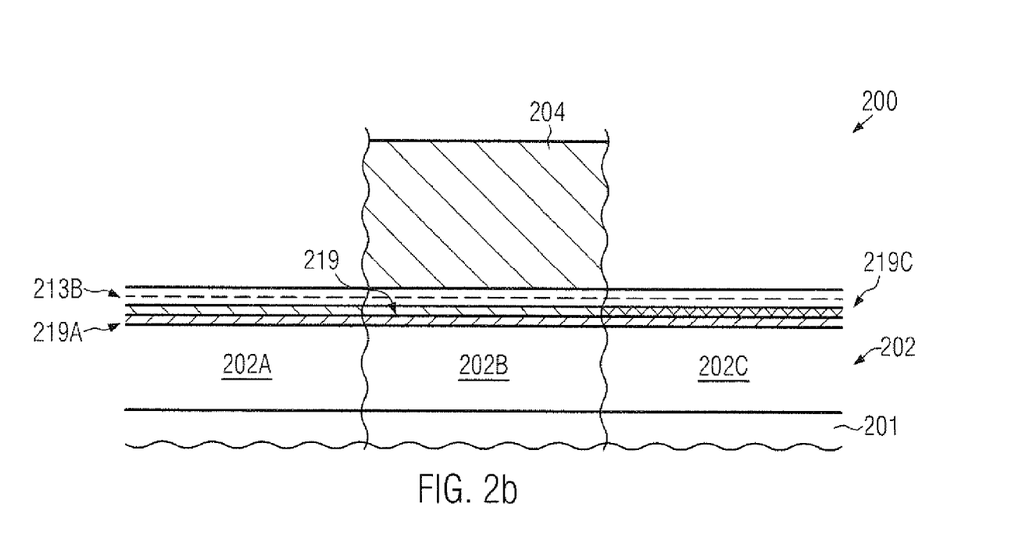

FIG. 2b schematically illustrates the semiconductor device 200 in a further advanced manufacturing stage. As illustrated, the dielectric material above the active regions 202A, 202C have been modified in its electronic behavior, as is indicated by 219A for the active region 202A and by 219C for the active region 202C, while the dielectric material above the active region 202B may exhibit a significantly less pronounced degree of modification. Moreover, in the manufacturing stage shown, a further diffusion cap layer 213B may be formed above the semiconductor layer 202 and may comprise any appropriate work function metal species in order to obtain a desired modification of the dielectric material 219 above the active region 202B. In the embodiment shown, it is assumed that the presence of the material 213B above the active regions 202A, 202C may be considered inappropriate during a subsequent further heat treatment. In this case, an appropriate etch mask 204m such as a resist mask, may be provided so as to cover the material above the active region 202B. In other cases, when an additional diffusion of the species 213B into one or both of the active regions 202A, 202C may be considered appropriate, a corresponding patterning of the material 213B may not be required.

Figure 2C:
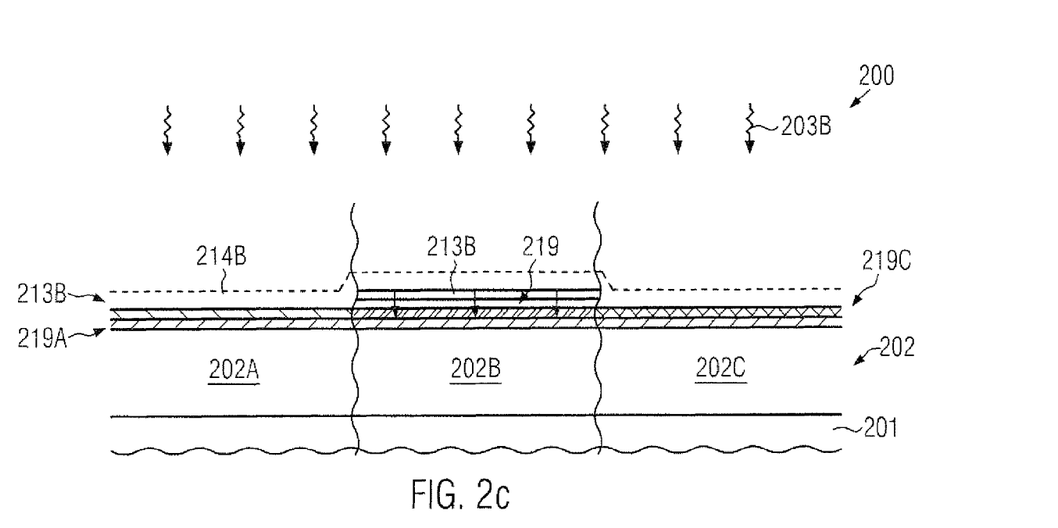

FIG. 2c schematically illustrates the semiconductor device 200 in a further advanced manufacturing stage. In the embodiment shown, the diffusion cap material 213B may be selectively formed above the active region 202B and may thus act as a source of a work function metal species during a further heat treatment 203B. The material 213B may be formed on the basis of the etch mask as described in FIG. 2b and using appropriate etch chemistries. Moreover, the material 213B may comprise a diffusion cap material, if required, for instance in the form of titanium nitride and the like, while, in other cases, if exposure of the dielectric materials 219A, 219C during the heat treatment 203B may be considered inappropriate, an additional cap material 214B, for instance in the form of titanium nitride and the like, may be provided so as to provide superior integrity during the heat treatment 203B. Thereafter, the layers 213B and the layer 214B, if provided, may be removed on the basis of well-established cleaning and etch recipes.

Figure 2D:
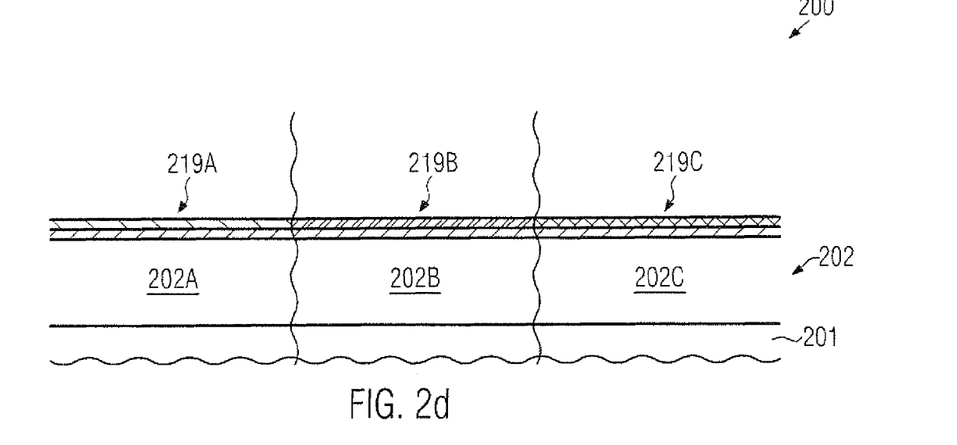

FIG. 2d schematically illustrates the semiconductor device 200 with a gate dielectric material 219B formed on the active region 202B and having electronic characteristics that are different from those of the dielectric materials 219A, 219C. Consequently, based on the sequence of heat treatments 203, 203b (FIGS. 2b and 2c), appropriate electronic characteristics of the gate dielectric material above the different active regions 202A, 202B, 202C may be adjusted in such a manner that, during the further processing, one or more electrode materials may commonly be provided for these active regions, while nevertheless obtaining the desired work function and thus threshold voltages.

It should further be appreciated that the above-described sequence may be extended by further deposition and masking steps in combination with additional heat treatments in order to provide more different types of dielectric materials so as to obtain the desired threshold voltages in combination with one or more electrode materials provided commonly for any type of gate electrode structure.

Figure 2E:
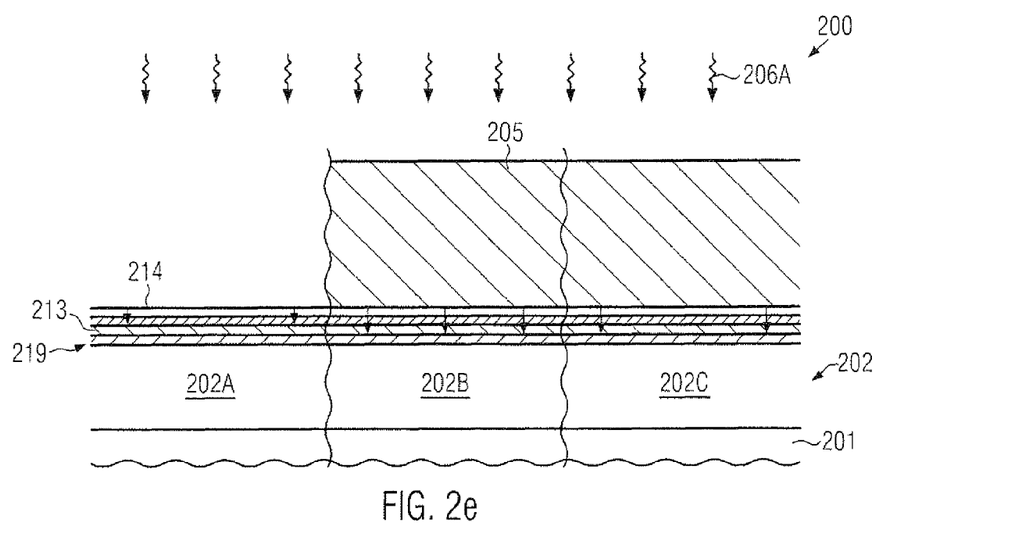
FIGS. 2e-2f schematically illustrate cross-sectional views of the semiconductor device during a sequence of anneal processes in which the diffusion activity may be controlled of the basis of varying anneal parameters obtained on the basis of a mask material providing a different optical response to a radiation-based anneal process, according to illustrative embodiments.

FIG. 2e schematically illustrates the semiconductor device 200 according to further illustrative embodiments in which the gate dielectric material 219 in combination with a work function metal species 213 and the cap layer 214 may commonly be formed above the active regions 202A, 202B, 202C. Moreover, an "anneal mask" 205 may be formed, for instance, above the active regions 202B, 202C in order to provide locally different anneal conditions during a first anneal process 206A. For this purpose, the "mask" 205 may be comprised of a material exhibiting superior absorption capabilities for a specific radiation wavelength, thereby locally increasing the energy deposition above the active regions 202B, 202C during an anneal process performed on the basis of a radiation source. It should be appreciated that a plurality of anneal techniques are available in which radiation energy, such as energy in the form of a laser beam, flashlight pulses and the like, may be deposited in device areas near the surface without significantly affecting lower lying material areas. Consequently, by appropriately "patterning" the absorption behavior of the device 200, the degree of energy deposition and thus of resulting temperature in an area near the surface of the device 200, such as in the active regions 202A, 202B, 202C, may be efficiently controlled. Consequently, on applying a predetermined set of process parameters for a given energy density and wavelength distribution of the radiation source used, different anneal temperatures may be obtained, thereby resulting in a desired high diffusion activity above the active regions 202B, 202C, while the corresponding local temperature above the active region 202A may be significantly less due to the pronounced reflective behavior of the cap layer 214. Consequently, even if the same layer stack is provided above each of the active regions 202A, 202B, 202C, the resulting configuration above the active regions 202B, 202C may significantly differ from the resulting electronic characteristics of the gate dielectric material 219 above the active region 202A.

Figure 2F:
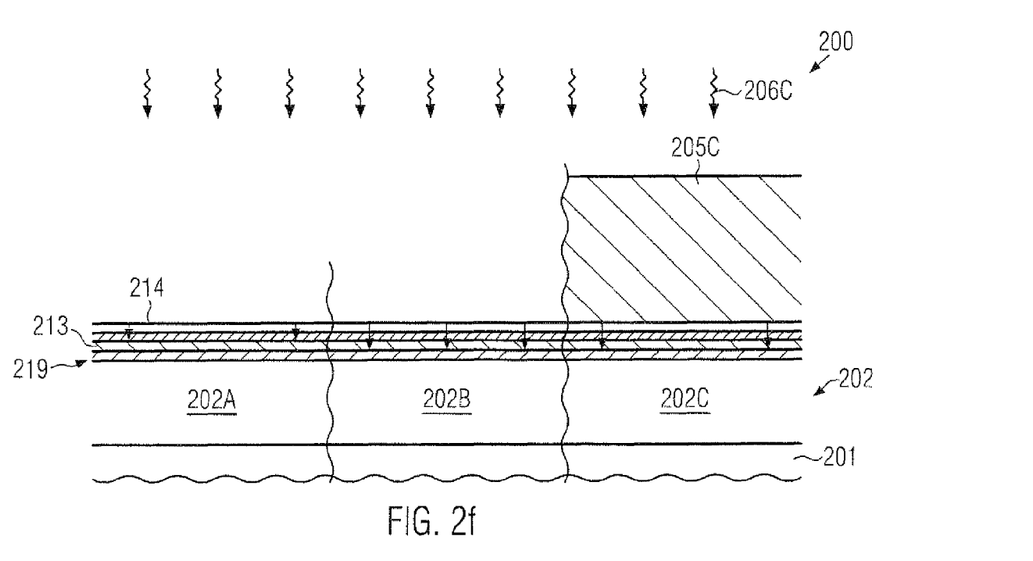

FIG. 2f schematically illustrates the device 200 in a further advanced manufacturing stage in which a portion of the mask 205 may be removed, thereby providing a mask 205C, while in other cases the mask 205 of FIG. 2e may be completely removed and may be replaced by the mask 205C. In the embodiment shown, the mask having the superior absorption capability may be provided locally above the active region 202C, thereby providing the desired high process temperature during a further heat treatment 206C. On the other hand, the diffusion activity above the active regions 202A, 202B may be significantly less pronounced. Consequently, an increased amount of work function metal species may be incorporated into the dielectric material 219 above the active region 202C, wherein a lesser amount may be incorporated above the active region 202B, while the dielectric material 219 above the active region 202A may have experienced the lowest degree of modification. Consequently, also in this case, different electronic characteristics may be obtained on the basis of a sequence of heat treatments, wherein the local diffusion characteristics may be adapted by providing different process parameters of a corresponding heat treatment. It should be appreciated that the process parameters of the treatments 206A (FIG. 2e) and 206C may be selected differently, depending on the difference in the degree of modification between the active region 202B and 202C. In other cases, the mask 205C may also cover the active region 202A when the general process parameters of the process 206C may be selected differently with respect to the heat treatment 206A of FIG. 2e. It should further be appreciated that additional masking steps and heat treatments may be performed so as to obtain a wider variety of different threshold voltages, if required. Furthermore, it is to be noted that the patterning of the characteristics of the gate dielectric material as shown in FIGS. 2e and 2f may also be combined with the process strategy described with reference to FIGS. 2a-2d. That is, in addition to providing different process parameters in a local manner during a single heat treatment, different work function metal species may also be provided and different material systems may also be used during the separate heat treatments.

Figure 2G:
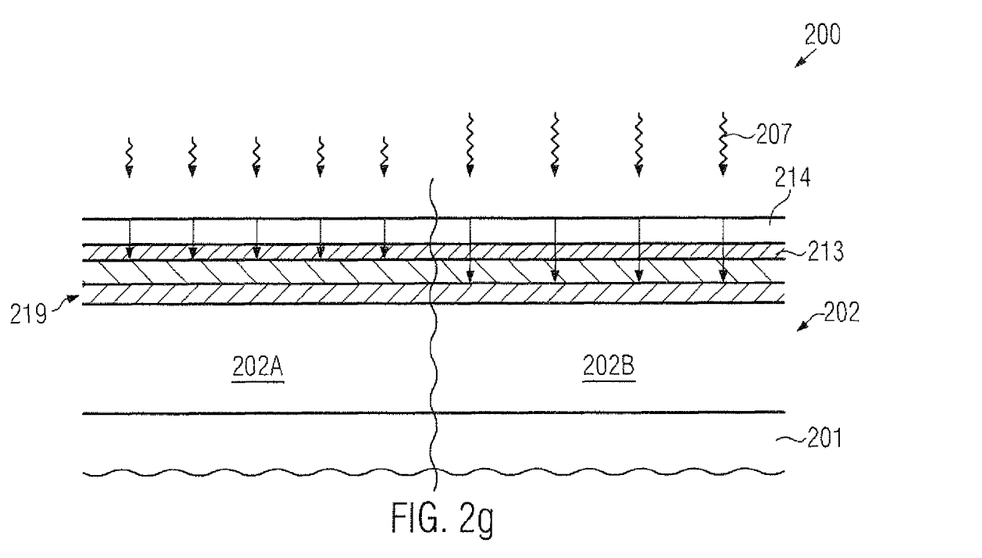
FIG. 2g schematically illustrates a cross-sectional view of the semiconductor device during an anneal sequence wherein different process parameters may be applied on the basis of an anneal process having per se a certain degree of spatial resolution, according to illustrative embodiments.

FIG. 2g schematically illustrates the semiconductor device 200 according to further illustrative embodiments in which the dielectric material 219 in combination with any appropriate diffusion cap layers, such as the layers 213, 214, may be formed above different semiconductor regions, such as the regions 202A, 202B. It should be appreciated, however, that the materials 213, 214 may represent different material systems, as is for instance previously explained with reference to the semiconductor device 100 or with reference to FIGS. 2a-2d. Moreover, it should be appreciated that the active regions 202A, 202B may represent or may be part of device areas having appropriate lateral dimensions so as to be within the spatial resolution capabilities of an anneal system that may perform an anneal process 207 based on radiation, wherein at least one process parameter may be locally varied in accordance with device requirements. For example, above the active region 202B, the anneal process 207 may be performed on the basis of increased temperatures and/or an increased process time compared to the active region 202A. In this manner, the diffusion activity may be appropriately patterned without requiring any additional mask steps. As previously indicated, radiation-based anneal systems are available in which a radiation of well-defined lateral dimensions, such as a laser beam, may be provided and may be scanned across a substrate. Consequently, using an appropriate scan scheme, the local process parameters above the regions 202B, 202A may be individually adjusted in accordance with the desired degree of modification of the corresponding portion of the gate dielectric material 219. Thus, by varying a scan speed and/or the energy density of the radiation beam, different process temperatures and/or process times may be achieved, thereby controlling the degree of diffusion in a desired manner. Consequently, threshold voltages may be patterned on the basis of the anneal process 207 without requiring additional mask steps as long as the lateral size of the regions 202B, 202A may be within the spatial resolution capability of a corresponding anneal system. It should be appreciated that the principles shown in FIG. 2g may also be applied in combination with the above-described process strategies, for instance additionally using an anneal mask and/or using different material systems above the various active regions.

Figure 2H:
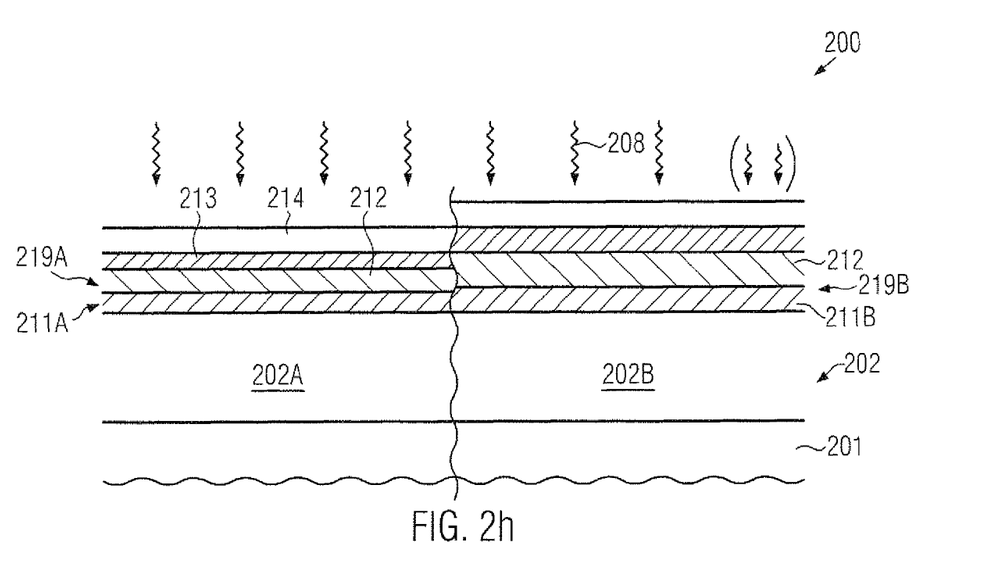
FIGS. 2h-2j schematically illustrate cross-sectional views of the semiconductor device in which diffusion of the work function metal species may be controlled on the basis of a different thickness of the gate dielectric material, possibly in combination with a sequence of anneal processes, according to still further illustrative embodiments.

FIG. 2h schematically illustrates the semiconductor device 200 according to further illustrative embodiments in which the electronic characteristics may be patterned, in addition to or alternatively to any one of the above-described process strategies, by providing a different thickness and/or material composition of the gate dielectric material. In the embodiment shown in FIG. 2h, a gate dielectric material 219A may be formed above the active region 202A and may comprise a dielectric base layer 211A in combination with the high-k dielectric material 212. Similarly, the dielectric material 219B may comprise a dielectric base layer 211B and the high-k dielectric material 212. Thus, in this embodiment, a difference in the gate dielectric materials 219A, 219B may be obtained by providing the dielectric base layer 211B with an increased thickness compared to the dielectric base layer 211A, while the high-k dielectric material 212 may have substantially the same configuration above both the active region 202A and the region 202B. Furthermore, in this example, the diffusion cap materials 213 and 214 may be provided above the active regions 202A, 202B so as to have substantially the same configuration. Consequently, during a heat treatment 208, the metal species may have a different distribution and distance above the active region 202B compared to the active region 202A, since in particular the materials 211A, 211B may act as efficient diffusion blocking materials. Consequently, corresponding dipole charges may have a greater distance from the semiconductor material of the region 202B compared to the semiconductor region 202A. Thus, for otherwise identical conditions, different electronic characteristics of the dielectric materials 219A, 219B may be achieved. The difference in thickness of the dielectric base layers 211A, 211B may be accomplished on the basis of any well-established process techniques, for instance by forming a first dielectric material, removing the dielectric material above the active region 202A and forming a second dielectric material above the regions 202A, 202B, thereby obtaining the increased thickness of the material 211B. However, any other process strategies may be applied.

It should further be appreciated that the heat treatment 208 may be performed on the basis of different process parameters for the different active regions 202A, 202B, for instance by applying any one of the above-described process strategies. Furthermore, in addition to varying a thickness of the gate dielectric material, different metal species may also be applied or cap layers may have a different material composition while nevertheless providing the same metal species, for instance by providing an aluminum layer above one active region, while using an aluminum nitride layer above the other active region. Furthermore, it is to be appreciated that the principles described in FIG. 2h may also be applied to more than two different active regions.

Figure 2I:
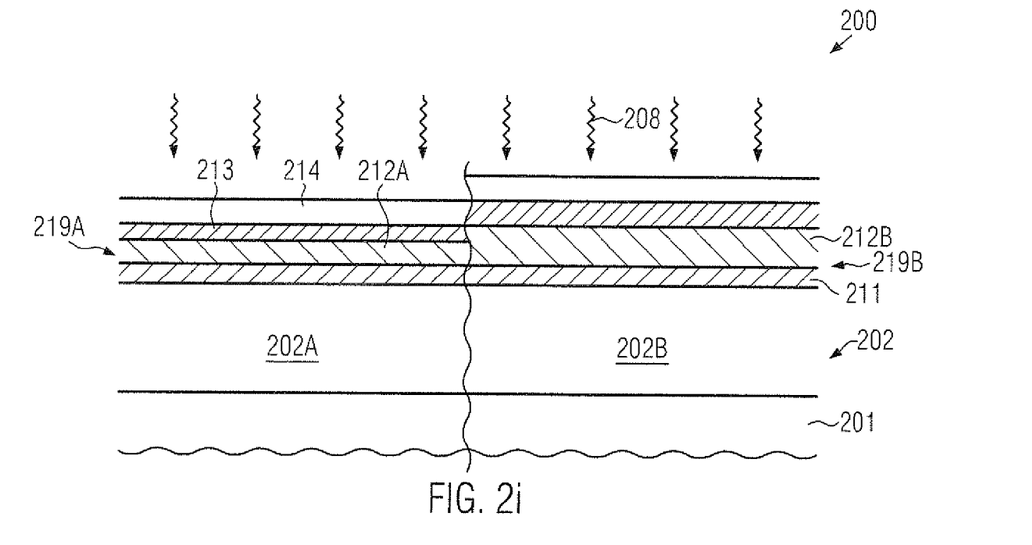

FIG. 2i schematically illustrates the semiconductor device 200 according to illustrative embodiments in which a difference in the dielectric materials 219A, 219B may be obtained by varying at least the thickness of the high-k dielectric material, as indicated by 212A, 212B, while the thickness of the dielectric base layer 211 may be the same, as shown in FIG. 2i, or may also vary, as is for instance shown in FIG. 2h. Furthermore, the diffusion cap layers 213, 214 may have the same configuration above both active regions 202A, 202B or may be provided differently, depending on the overall process strategy. Thus, upon performing the heat treatment 208, a different degree of diffusion and thus modification in combination with the difference in thickness may be achieved, thereby obtaining different threshold voltages of transistor elements still to be formed.

Figure 2J:
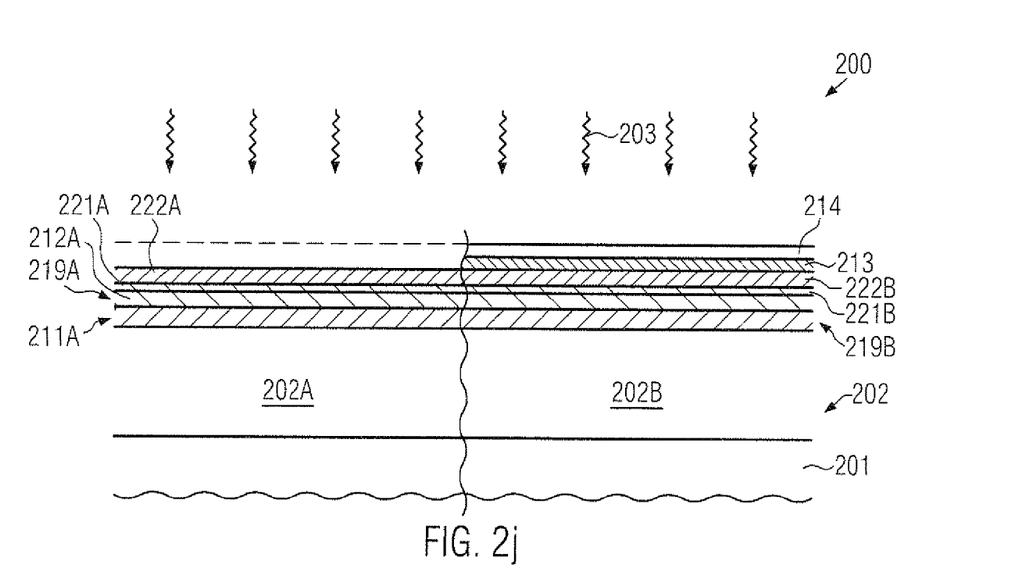

FIG. 2j schematically illustrates the semiconductor device 200 according to illustrative embodiments in which the different gate dielectric materials 219A, 219B may be obtained by providing a different material composition and/or a different thickness, for instance by providing a stack of layers 211A, 212A in combination with one or more further layers, such as layers 221A, 222A. For example, the layers 211A, 212A may represent a dielectric base layer and a high-k dielectric material which may have already incorporated therein a work function metal species, for instance incorporated by a preceding heat treatment, as previously explained. Thereafter, a further dielectric material, such as the layers 221A, 222A, may be formed, thereby providing a different thickness of the entire gate dielectric material 219A. On the other hand, the dielectric materials 211B and 212B may also have incorporated therein a desired metal species, as may be appropriate for other semiconductor regions, and thereafter the layers 221B, 222B may be formed, which may have the same or a different composition compared to the layers 221A, 222A. Furthermore, an additional metal species 213 in combination with a cap material 214 may be provided, for instance, selectively above one of the regions 202A, 202B, if considered appropriate. Hence, during a further heat treatment 203, the metal species may be incorporated into the layer 222B, thereby obtaining the material 219B having different electronic characteristics compared to other active regions, which may not have formed thereon the layers 221B, 222B, wherein also a difference with respect to materials 221A, 222A may be obtained, if the cap layers 213, 214 are correspondingly patterned, as is shown in FIG. 2h.

It should be appreciated that a plurality of process strategies may be applied in providing dielectric materials differing in thickness and/or material composition in various semiconductor regions, while also any of these concepts may be advantageously combined with any process techniques described above in which different anneal parameters may be applied, if required.

Figure 2K:
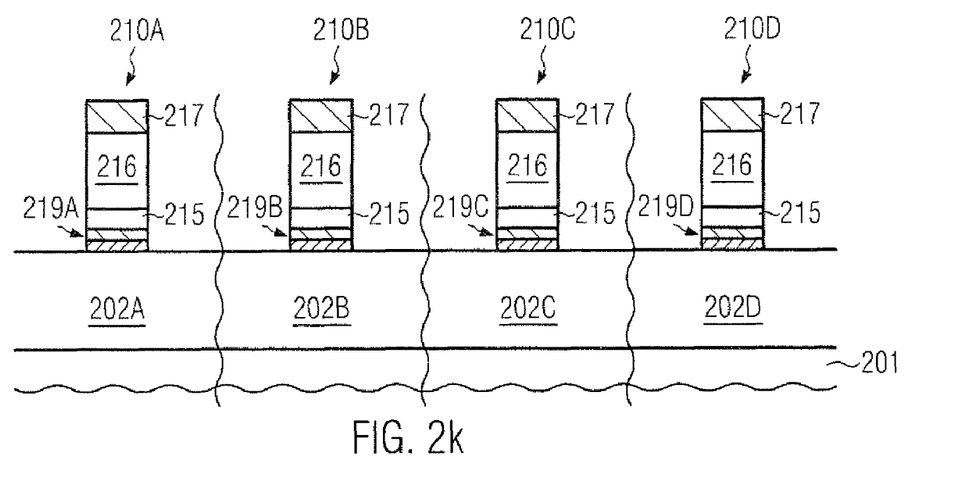
FIG. 2k schematically illustrates gate electrode structures having the same configuration with respect to the electrode materials, wherein a work function may be different, according to illustrative embodiments.

FIG. 2k schematically illustrates the semiconductor device 200 in a further advanced manufacturing stage. As illustrated, a plurality of gate electrode structures 210A, 210B, 210C, 210D are respectively formed above active regions 202A, 202B, 202C, 202D. The gate electrode structure 210A may comprise a gate dielectric material 219A that provides, in combination with an electrode material 215 and the electronic characteristics of the active region 202A, a desired work function and thus threshold voltage. Similarly, the gate electrode structure 210B may comprise the gate dielectric material 219B with an appropriately set work function with respect to the electrode material 215. Similarly, the gate electrode structure 210C may comprise the gate dielectric material 219C so as to correspond to the gate electrode material 215 and the semiconductor region 202C. Finally, the gate electrode structure 210D may comprise a gate dielectric material 219D so as to provide, in combination with a gate electrode material 215, a desired threshold voltage. For example, the gate dielectric materials 219A and 219B may differ from each other by the amount of work function metal species contained therein if, for instance, the regions 202A, 202B may correspond to the same conductivity type. On the other hand, the dielectric material 219C may differ from one or more of the other dielectric materials by its material composition, for instance a plurality of dielectric layers may be formed therein, in some of which may be incorporated a desired work function metal species. The dielectric material 219D may differ from one or more of the other dielectric materials in a thickness, even if physically the same configuration of dielectric materials may be provided as in some of the other gate electrode structures. It should be appreciated that any other differences may be provided in the gate dielectric materials in accordance with any one of the above-described process sequences or any combination thereof. Furthermore, the gate electrode structures 210A, 210B, 210C, 210D may have substantially the same configuration with respect to the electrode material 215 and a further electrode material 216, for instance provided in the form of a silicon material and the like. Additionally, a cap layer 217 may be provided in all of the gate electrode structures 210A, 210B, 210C, 210D. Consequently, the gate electrode structures 210A, 210B, 210C, 210D may have the same configuration, except for any process-related variations, with respect to the materials 215, 216 and 217, while any slight differences, for instance in height, material composition and the like, may be present in the dielectric materials 219A, 219B, 219C, 219D, which, however, may not significantly affect the overall patterning process. It should be appreciated that the gate electrode structures 210A, 210B, 210C, 210D may thus be efficiently formed on the basis of sophisticated well-established lithography and patterning regimes.

Figure 2L:
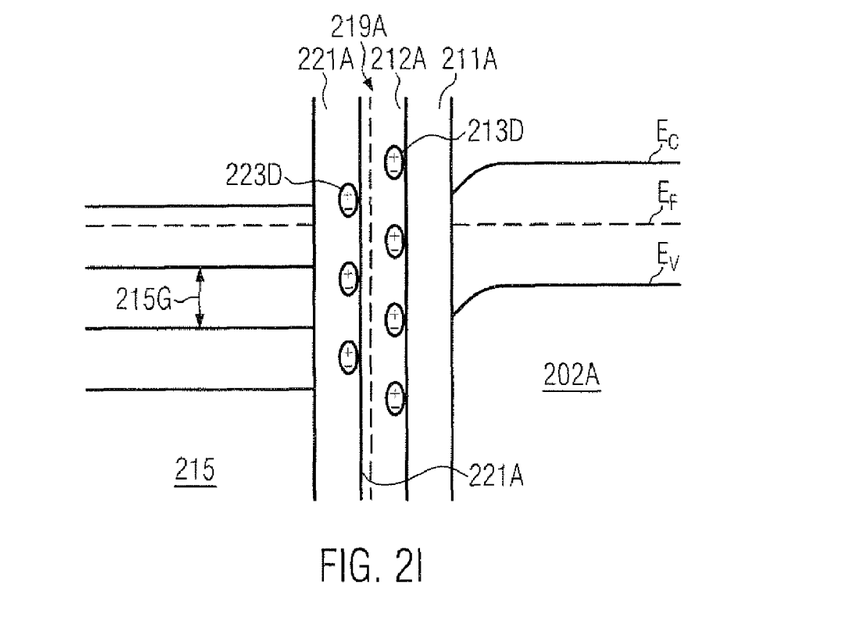
FIG. 2l schematically illustrates a band model of a gate electrode structure including a multiple diffused gate dielectric material, according to illustrative embodiments.

FIG. 2l schematically illustrates an example of a modified band structure for a gate dielectric material 219A comprising a dielectric base layer 211A forming an interface with the active region 202A that is illustrated at the right hand side of FIG. 2l. Furthermore, high-k material layers 221A, 212A may form an interface with the electrode material 215, as shown at the left hand side of FIG. 2l. Furthermore, the layer 212a may comprise dipole charges 213D caused by a metal species incorporated on the basis of any of the above-described process techniques. Similarly, the layer 221A may comprise dipole charges 223D, which may also be generated by a metal species which may be incorporated by any of the above-described process techniques. It should be appreciated that, if desired, a thin dielectric material may be provided between the layers 221A and 212A, if an intermediate diffusion blocking material may be required. Consequently, different work functions may be caused in the material 215, as indicated by a band gap 215G, which may also result in an appropriate shift of the valence band edge and the conduction band edge at the interface between the materials 211A and the channel region in the active region 202A.

Consequently, by designing the electronic characteristics of the gate dielectric material 219 in a different manner for a plurality of different devices, an appropriate adaptation of the work function may be obtained for the same electrode material, as explained above.

Figure 2M:
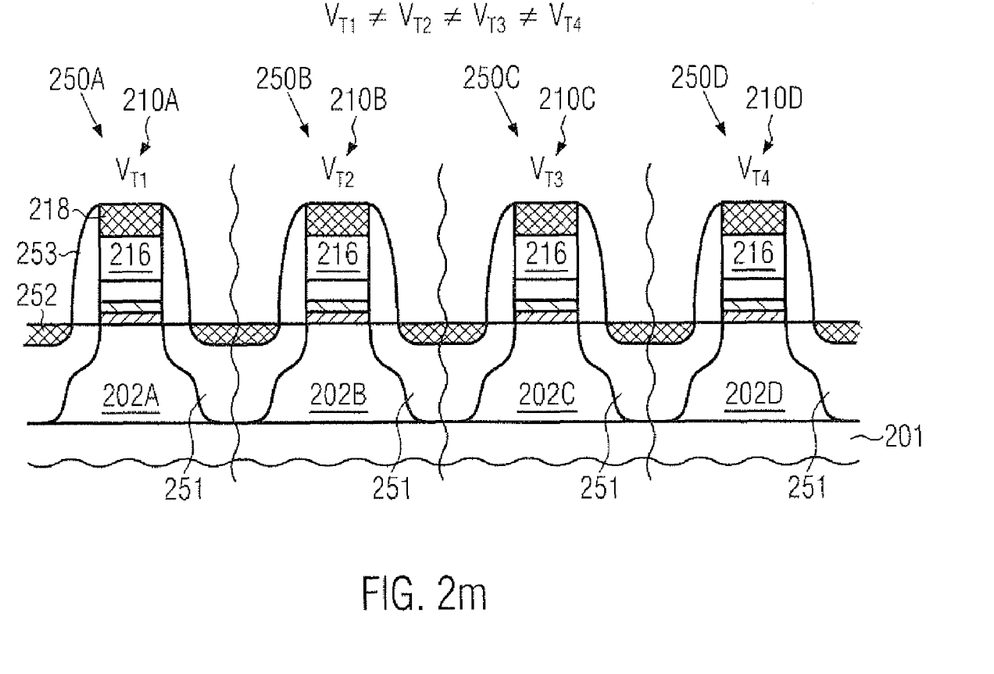
FIG. 2m schematically illustrates a plurality of transistors having different threshold voltages, while the gate electrode material may be the same for each of the transistors, according to further illustrative embodiments.

FIG. 2m schematically illustrates the semiconductor device 200 in a further advanced manufacturing stage in which transistors 250A, 250B, 250C, 250D may be provided in and above the active regions 202A, 202B, 202C, 202D. As illustrated, the transistors 250A, 250B, 250C, 250D may comprise drain and source regions 251 in combination with metal silicide regions 252 and a sidewall spacer structure 253. Furthermore, a metal silicide region 218 may also be formed in the electrode material 216 of each of the gate electrode structures 210A, 210B, 210C, 210D.

The transistors 250A, 250B, 250C, 250D may be formed on the basis of any appropriate process technique, i.e., after completing the gate electrode structures, as is for instance shown in FIG. 2k, the drain and source regions 251 in combination with the sidewall spacer structure 253 may be formed, followed by any anneal processes for activating the dopant species and re-crystallizing implantation-induced damage. Thereafter, the metal silicide regions 252 and 218 may be formed in accordance with well-established silicidation techniques.

It should be appreciated that the process sequence may include any process strategy for reliably confining the sensitive dielectric material 219A and the electrode material 215 of the gate electrode structures 210A, 210B, 210C, 210D as shown in FIG. 2k. Furthermore, the cap layers 217 (FIG. 2k) may be removed prior to at least forming the metal silicide regions 218 in accordance with any appropriate process technique.

Due to the different electronic characteristics of the gate electrode structures 210A, 210B, 210C, 210D, the threshold voltages of the transistors 250A, 250D may differ from each other, even if these transistors represent transistors of the same conductivity type. Thus, corresponding threshold voltages $V_{T1}$, $V_{T3}$, $V_{T3}$, $V_{T4}$ may be different. In other cases, some of the transistors 250A, 250B, 250C, 250D may differ in conductivity type from each other while nevertheless substantially the same gate electrode structure may be provided, except for the differences in the gate dielectric materials, as discussed above.

As a result, the present disclosure provides semiconductor devices and manufacturing techniques in which a work function and thus threshold voltage of transistors requiring different threshold voltage levels may be adjusted in an early manufacturing stage, i.e., prior to actually patterning the gate electrode structure, while nevertheless providing a very uniform patterning process regime. To this end, the diffusion of a work function metal species may be controlled differently for the various types of transistor elements to be formed, which may, for instance, be accomplished by performing multiple anneal processes, possibly in combination with different gate dielectric layer stacks and/or different work function metal species.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming transistors of different threshold voltages, the method comprising:
    forming a dielectric base layer and a high-k dielectric material above a plurality of semiconductor regions, a thickness of at least one of said dielectric base layer and said high-k dielectric material being different for each of said plurality of semiconductor regions;
    forming a first metal-containing layer comprising a first work function metal species above said high-k dielectric material in at least a first region of said plurality of semiconductor regions;
    performing a first heat treatment so as to diffuse said first work function metal species from said first metal-containing material into at least said high-k dielectric material above said at least said first region of said plurality of semiconductor regions;
    forming a second metal-containing layer comprising a second work function metal species that is different from said first work function metal species above said high-k dielectric material in at least a second region of said plurality of semiconductor regions;
    after performing said first heat treatment, performing a second heat treatment so as to diffuse said second work function metal species from said second metal-containing material into at least said high-k dielectric material above said at least said second region of said plurality of semiconductor regions;
    forming an electrode material above said high-k dielectric material above each of said plurality of semiconductor regions;
    forming a gate electrode structure on each of said plurality of semiconductor regions from said electrode material, said dielectric base layer and said high-k dielectric material; and
    forming drain and source regions in each of said plurality of semiconductor regions.

2. The method of claim 1, further comprising removing said first metal-containing material layer after performing said first heat treatment.

3. The method of claim 1, wherein forming said electrode material comprises providing at least one metal-containing electrode material.

4. The method of claim 1, wherein performing said second heat treatment comprises applying different process parameter settings of said first heat treatment.

5. The method of claim 4, wherein applying different process parameter settings comprises using different effective surface temperatures in said at least said first and second regions of said plurality of semiconductor regions.

6. The method of claim 4, wherein applying different process parameter settings comprises using a different process time in said at least said first and second regions of said plurality of semiconductor regions.

7. The method of claim 1, wherein at least one of said first and second metal-containing material layers comprises at least one of lanthanum and aluminum.

8. The method of claim 3, wherein said at least one metal-containing electrode material comprises titanium and nitrogen.

9. The method of claim 1, wherein forming said electrode material comprises forming a semiconductor material above said plurality of semiconductor regions.

10. A method, comprising:
forming a high-k dielectric material and a metal-containing material above a first semiconductor region and a second semiconductor region of a semiconductor device;
adjusting a first work function level for said first semiconductor region and a second work function level for said second semiconductor region by controlling diffusion of a metal species into said high-k dielectric material, said first and second work function levels differing from each other;
forming an electrode material above said first and second semiconductor regions;
forming a first gate electrode structure on said first semiconductor region and a second gate electrode structure on said second semiconductor region by using said high-k dielectric material and said electrode material; and
forming a first transistor in and above said first semiconductor region and a second transistor in and above said second semiconductor region, said first and second transistors having the same conductivity type.

11. The method of claim 10, further comprising removing said metal-containing material from above said high-k dielectric material prior to forming said electrode material.

12. The method of claim 10, wherein controlling diffusion of a metal species into said high-k dielectric material comprises providing said metal-containing material so as to have a different material composition above said first and second semiconductor regions.

13. The method of claim 10, wherein controlling diffusion of a metal species into said high-k dielectric material comprises providing said high-k dielectric material so as to differ in at least one of thickness and material composition above said first and second semiconductor regions.

14. The method of claim 10, wherein controlling diffusion of a metal species into said high-k dielectric material comprises providing a first metal-containing material selectively above said first semiconductor region, performing a first heat treatment, providing a second metal-containing material above said second semiconductor region and performing a second heat treatment.

15. The method of claim 10, wherein controlling diffusion of a metal species into said high-k dielectric material comprises performing a heat treatment and applying a different process parameter setting for said first and second semiconductor regions.

16. The method of claim 10, wherein forming an electrode material comprises forming a metal-containing electrode material on said high-k dielectric material and forming a semiconductor material on said metal-containing electrode material.

17. The method of claim 1, further comprising removing said second metal-containing material layer after performing said second heat treatment.

* * * * *